(12) United States Patent
Bartlett et al.

(10) Patent No.: US 6,649,830 B1
(45) Date of Patent: Nov. 18, 2003

(54) HOUSING FOR CIRCUIT CARDS

(75) Inventors: James Edward Bartlett, Cary, NC (US); Deborah H. Heller, Raleigh, NC (US); Jeffrey R. McClellan, Raleigh, NC (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 0 days.

(21) Appl. No.: 10/155,686

(22) Filed: May 24, 2002

(51) Int. Cl.$^7$ .................................................. H02G 3/08
(52) U.S. Cl. ...................... 174/50; 174/52.1; 220/4.02; 361/796; 361/679
(58) Field of Search .......................... 174/50, 51, 52.1, 174/17 VA, 53, 59, 17 R; 220/3.2, 3.3, 4.02; 361/679, 683, 688, 690, 692, 694, 695, 724, 725, 727, 796, 797; 165/80.2, 104.33, 122; 454/184; 455/347, 348, 349, 338; 312/223.1

(56) References Cited

U.S. PATENT DOCUMENTS

| | | | | |
|---|---|---|---|---|
| 3,594,490 A | * | 7/1971 | Mitchell et al. | 174/51 |
| 3,733,523 A | * | 5/1973 | Reynolds et al. | 361/756 |
| 4,327,835 A | * | 5/1982 | Leger | 361/756 |
| 4,391,904 A | * | 7/1983 | Litman et al. | 435/7.91 |
| 4,517,625 A | * | 5/1985 | Frink et al. | 361/755 |
| 4,558,398 A | * | 12/1985 | Drake | 361/797 |
| 5,008,779 A | * | 4/1991 | Salmon | 361/797 |
| 5,343,357 A | * | 8/1994 | Driscoll et al. | 361/685 |
| 5,490,723 A | * | 2/1996 | Driscoll et al. | 312/223.1 |
| 5,546,273 A | * | 8/1996 | Harris | 361/697 |
| 5,595,316 A | * | 1/1997 | Gallarelli et al. | 220/3.7 |
| 5,877,938 A | * | 3/1999 | Hobbs et al. | 361/724 |
| 5,923,532 A | * | 7/1999 | Nedved | 361/752 |
| 5,946,193 A | * | 8/1999 | Hendrix et al. | 361/704 |
| 5,978,223 A | * | 11/1999 | Hamilton et al. | 174/16.3 |
| 6,008,995 A | * | 12/1999 | Pusateri et al. | 361/796 |
| 6,054,198 A | * | 4/2000 | Bunyan et al. | 428/40.5 |
| 6,096,414 A | * | 8/2000 | Young | 428/220 |
| 6,157,534 A | * | 12/2000 | Gallagher et al. | 361/683 |
| 6,330,152 B1 | * | 12/2001 | Vos et al. | 361/688 |
| 6,432,497 B2 | * | 8/2002 | Bunyan | 428/40.1 |
| 6,434,018 B1 | * | 8/2002 | Waltz | 361/796 |

* cited by examiner

Primary Examiner—Chau N. Nguyen
Assistant Examiner—Angel R. Estrada
(74) Attorney, Agent, or Firm—Fogg and Associates, LLC; Jon M. Powers

(57) ABSTRACT

A housing for a plurality of electronic circuit cards is provided. The housing includes a shell and a single door adapted to selectively close the shell. The housing has a first shelf having opposing first and second edges in frictional engagement with the shell to thermally couple the first shelf to the shell. Moreover, the housing has a second shelf having opposing first and second edges directly contacting the shell to thermally couple the second shelf to the shell. The first and second shelves define a space therebetween for containing the plurality of electronic circuit cards. A backplane is disposed within the shell. The second shelf is removably attached to the shell to enable the backplane to be installed or removed via the single door.

46 Claims, 10 Drawing Sheets

HOUSING FOR CIRCUIT CARDS

TECHNICAL FIELD

The present invention relates generally to the field of electronic equipment and, in particular, to housings for electronic equipment.

BACKGROUND

Many housings for electronic equipment, such as telecommunications housings, contain and environmentally protect electronic circuit cards, such as line cards, management cards, splitter cards, or the like. The electronic circuit cards are often located in a space between two card-guide shelves (or plates) and are electrically connected to backplanes within the housings. Each of the two card-guide shelves has a number of slots such that when an electronic circuit card is located between the two card-guide shelves, opposite edges of the electronic circuit card each respectively reside in a slot of each of the shelves.

Card-guide shelves are usually mounted within a housing so that a gap, e.g., an air gap, exists between the card-guide shelves and the housing. However, this often results in excessive temperatures within the housing because heat generated by electronic circuits cards located between the card-guide shelves that is transferred to either of the card-guide shelves is not readily transferred across the air gap and thus through the housing to the environment outside the housing. Therefore, card-guide shelves of some housings are held in direct contact with the housing by substantially permanently attaching the card-guide shelves to the housing, such as by riveting or the like. However, this requires an additional door-covered opening (e.g., in addition to a door-covered opening for accessing the electronic circuit cards) on the housing for providing access for installing and removing the backplane. An additional opening and door increases manufacturing costs. Moreover, the additional door adds to maintenance costs, e.g., hinge repair or replacement, weather seal replacement, etc.

For the reasons stated above, and for other reasons stated below that will become apparent to those skilled in the art upon reading and understanding the present specification, there is a need in the art for alternatives to existing housings for electronic equipment.

SUMMARY

The above-mentioned problems with existing housings for electronic equipment and other problems are addressed by embodiments of the present invention and will be understood by reading and studying the following specification.

In one embodiment, a housing for a plurality of electronic circuit cards is provided. The housing includes a shell and a single door adapted to selectively close the shell. The housing has a first shelf having opposing first and second edges in frictional engagement with the shell to thermally couple the first shelf to the shell. Moreover, the housing has a second shelf having opposing first and second edges directly contacting the shell to thermally couple the second shelf to the shell. The first and second shelves define a space therebetween for containing the plurality of electronic circuit cards. A backplane is disposed within the shell. The second shelf is removably attached to the shell to enable the backplane to be installed or removed via the single door.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide housings for electronic circuit cards. The housing includes a single door for selectively opening and closing the housing. A first shelf frictionally engages the housing to thermally couple the first shelf to the housing, and a second shelf directly contacts the housing to thermally couple the second shelf to the housing. This improves heat transfer between the shelves and the housing compared to situations where an air gap separates shelves from the housing. At least one of the shelves is removably attached to the housing to enable a backplane of the housing to be installed or removed via the single door. This eliminates the need for an additional door-covered opening for removing or installing the backplane within the housing, as is the case with housings where all of the shelves are substantially permanently attached to the housing.

Figure 1:
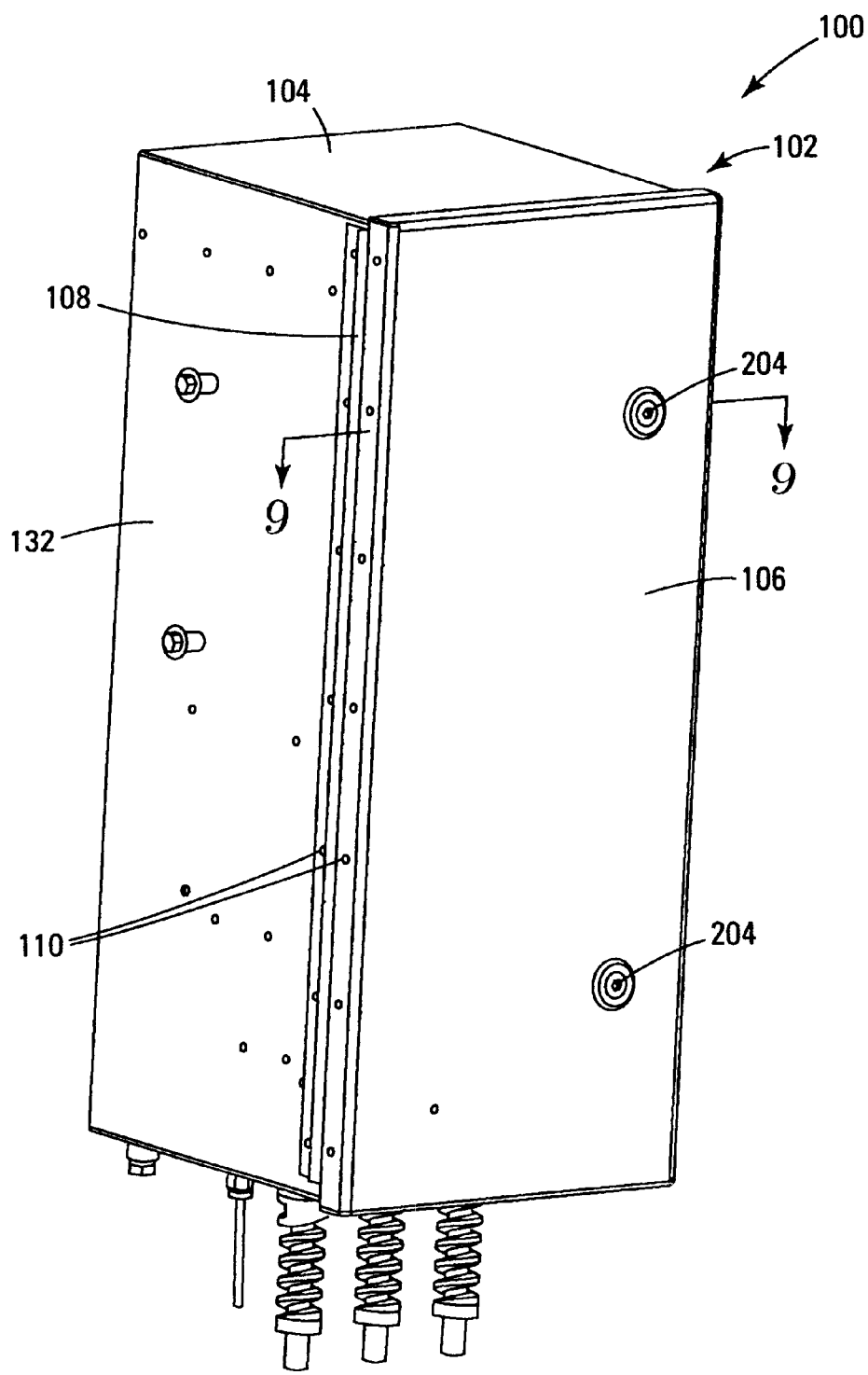
FIG. 1 is an isometric view of an electronic module according to an embodiment of the present invention.

FIG. 1 is an isometric view of an electronic module 100, such as a telecommunications module, according to an embodiment of the present invention. Electronic module 100 includes a housing 102 for containing electronic circuit cards of electronic module 100. Housing 102 includes a shell 104 and a single door 106 adapted to selectively close housing 102. In one embodiment, a hinge 108, such as a piano hinge, pivotally attaches door 106 to shell 104. In various embodiments, fasteners 110, such as bolts, cap screws, or the like, fasten hinge 108 to shell 104 and door 106.

Figure 2:
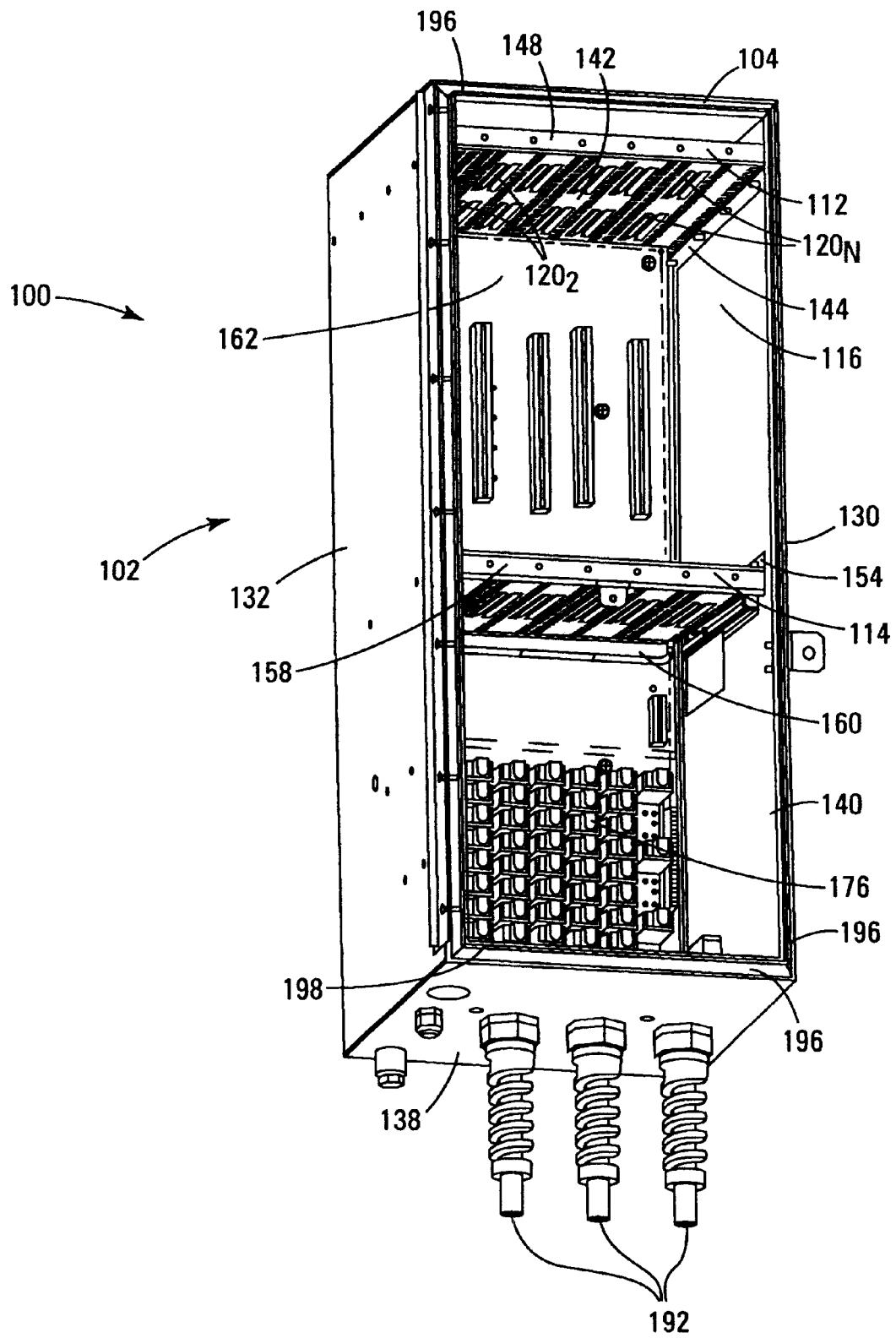
FIG. 2 is an isometric view of the electronic module of FIG. 1 with a door removed.
Figure 3:
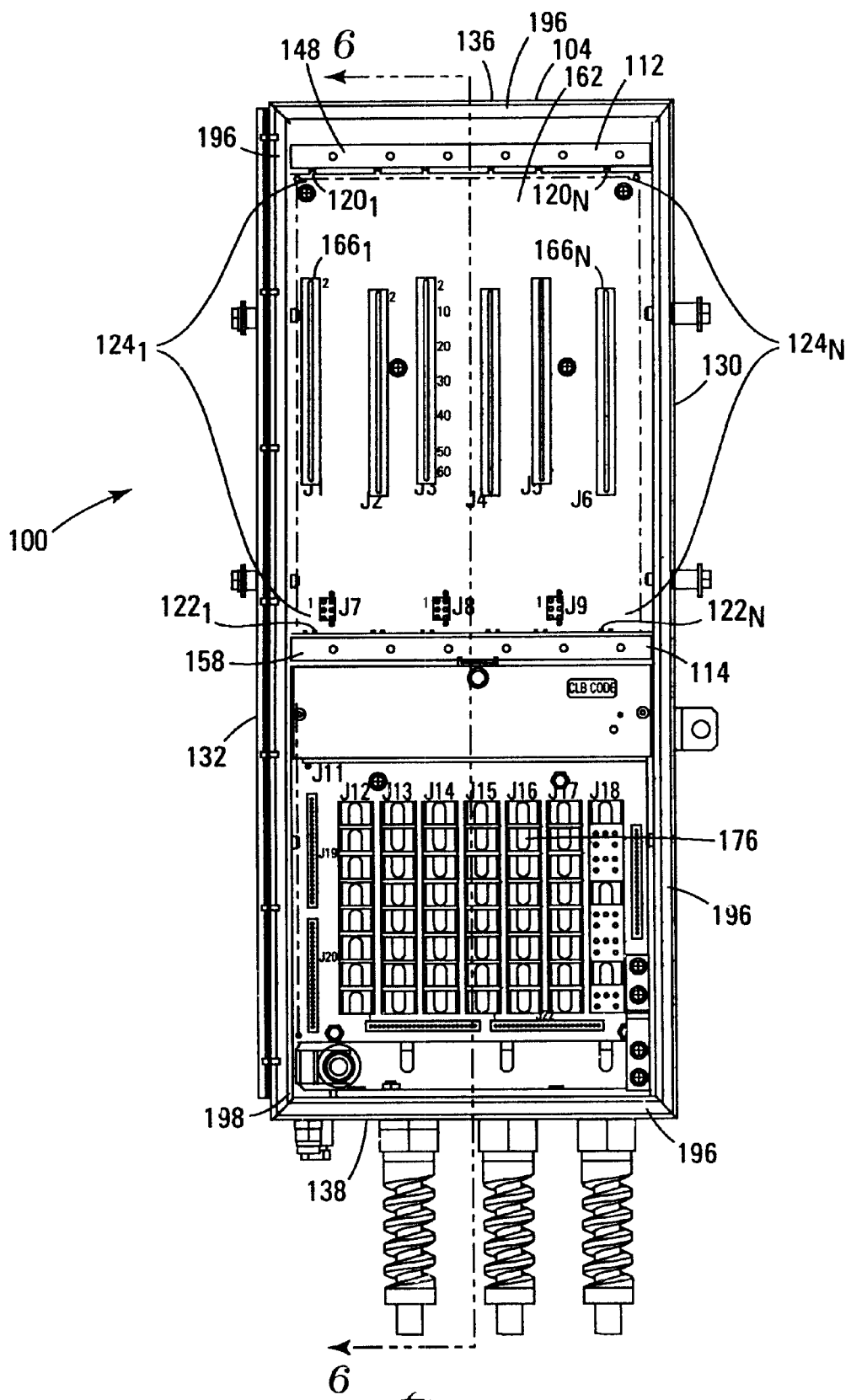
FIG. 3 is a front view of FIG. 2.
Figure 4:
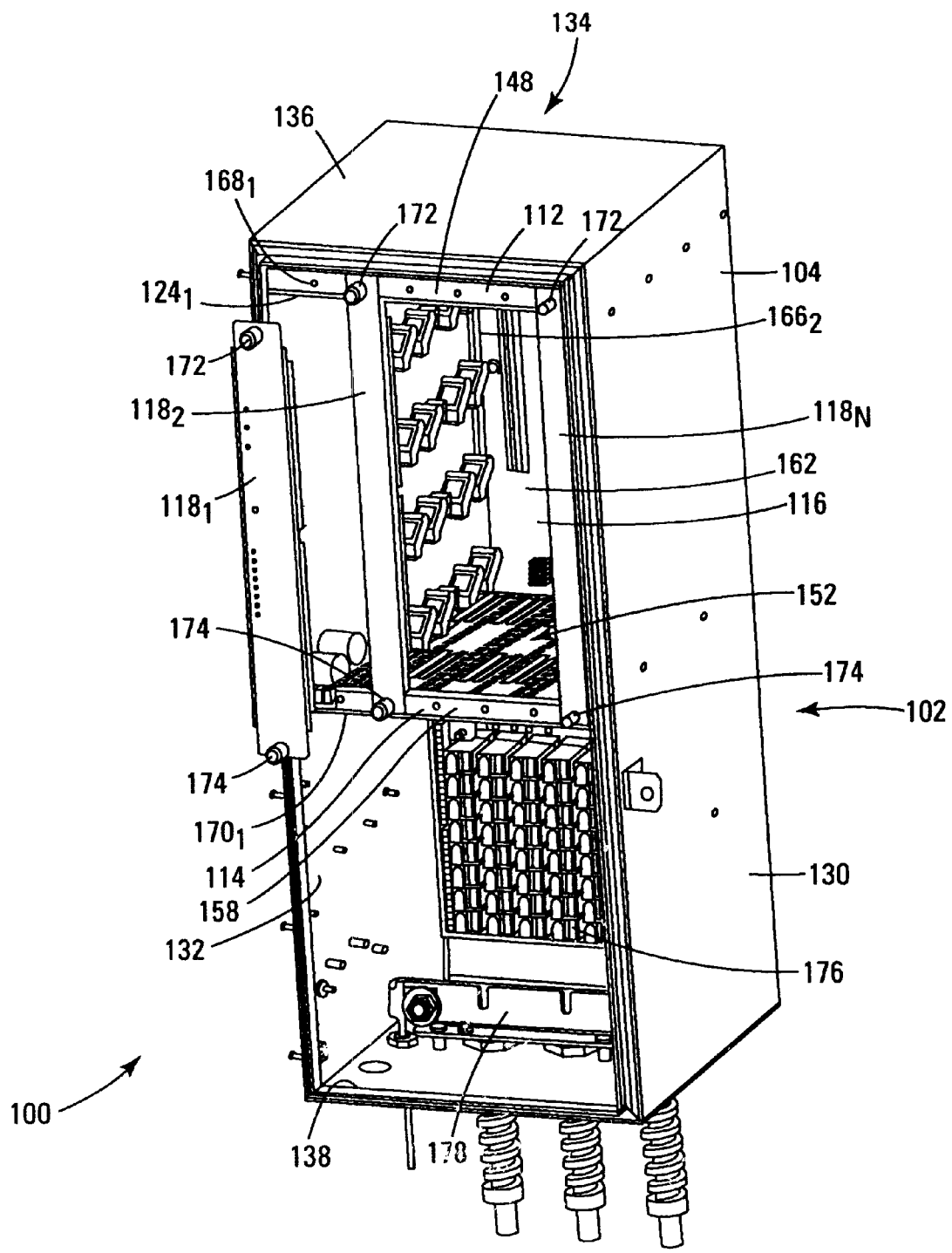
FIG. 4 is another isometric view of the electronic module of FIG. 1 with the door removed.
Figure 5:
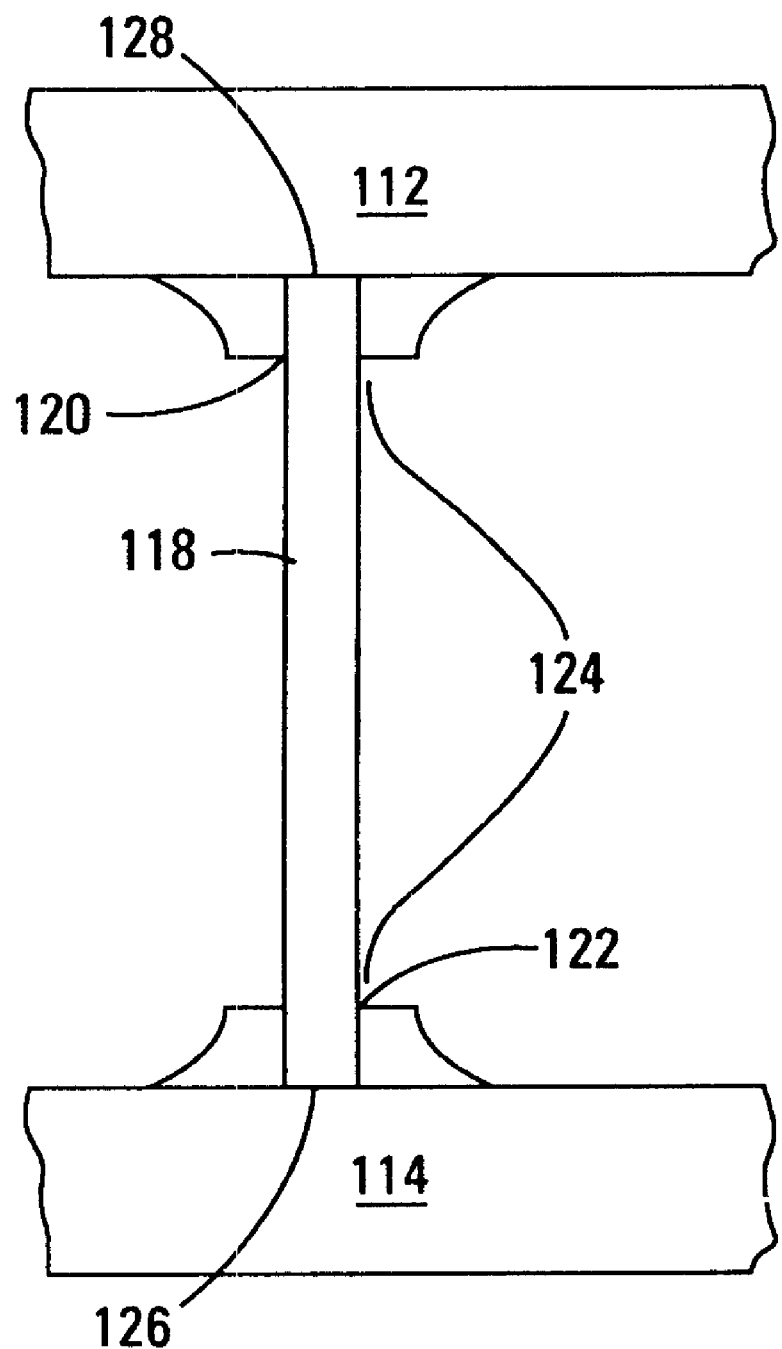
FIG. 5 is a cross-sectional view illustrating an electronic circuit card inserted in slots of shelves of the electronic module of FIG. 1 according to an embodiment of the present invention.

FIGS. 2–4 illustrate electronic module 100 with door 106 removed. FIG. 2 is an isometric view, FIG. 3 a front view of FIG. 2, and FIG. 4 another isometric view. Shelves 112 and 114 are disposed within shell 104 and define a space 116 between them for containing electronic circuit cards $118_1$ to $118_N$, such as line cards, management cards, splitter cards, or the like, as shown in FIG. 4. In one embodiment, shelf 112 includes slots $120_1$ to $120_N$, and shelf 114 includes slots $122_1$ to $122_N$. Each of slots $120_1$ to $120_N$ of shelf 112 respectively align with the slots of $122_1$ to $122_N$ of shelf 114 to form aligned pairs of slots $124_1$ to $124_N$, as shown in FIG. 3. Each of aligned pairs of slots $124_1$ to $124_N$ respectively receives each of electronic circuit cards $118_1$ to $118_N$. For example, FIG. 4 illustrates aligned pair of slots $124_1$ receiving electronic circuit card $118_1$. FIG. 5 is a cross-sectional view illustrating that opposing edges 126 and 128 of each of electronic circuit cards 118 are respectively received within slots 120 and 122 of each of aligned pairs of slots 124. In various embodiments, electronic module 100 is an asymmetric digital subscriber line remote access multiplexer, such as a PG-Flex$^{Plus}$ Edge RAM available from ADC Telecommunications, Eden Prairie, Minn.

Figure 6:
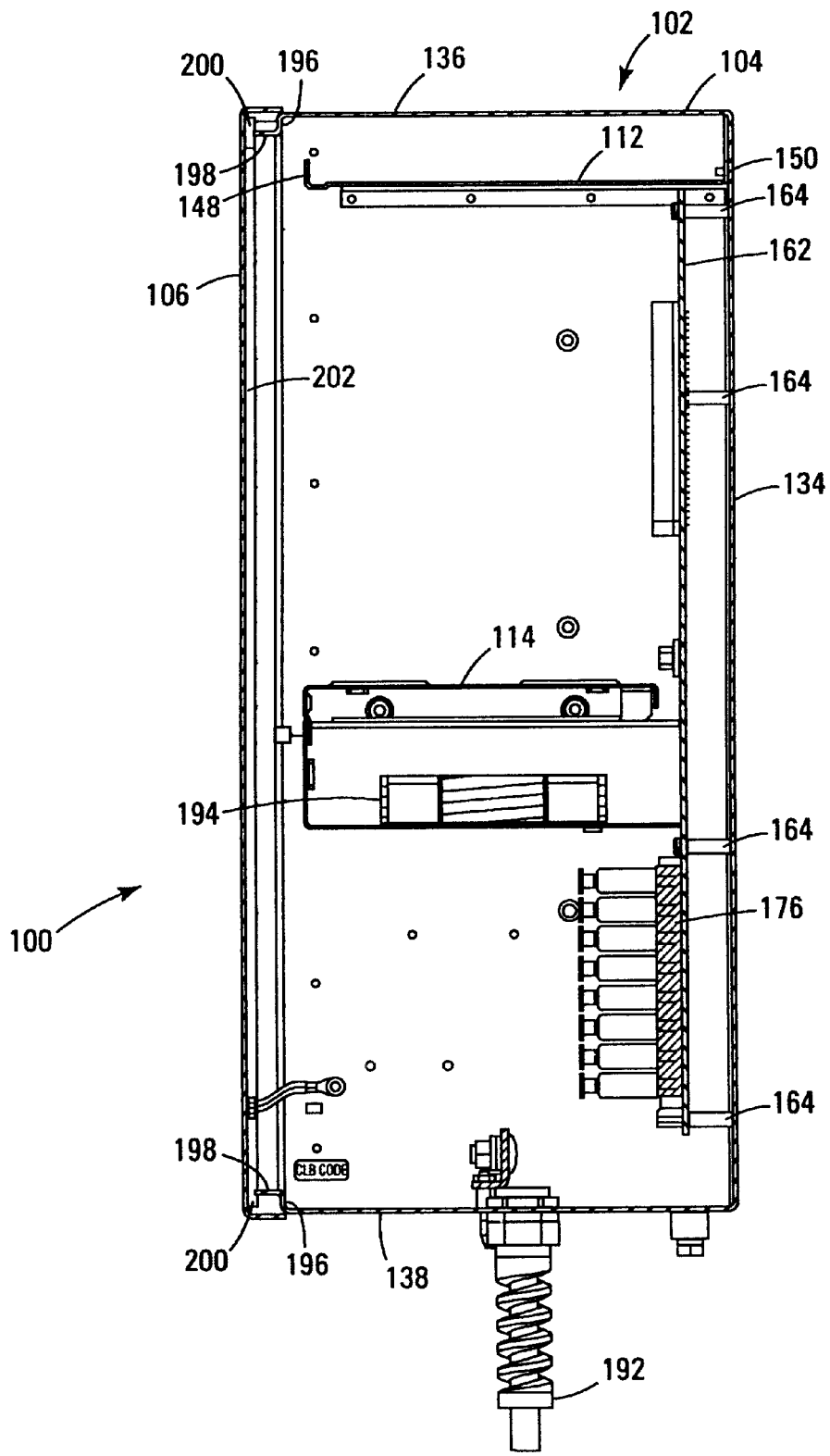
FIG. 6 is a view taken along line 6—6 of FIG. 3.

Shell 104 includes opposing sidewalls 130 and 132, as shown in FIGS. 2–4. Shell 104 also includes a wall 134, as shown in FIG. 6, a view taken along line 6—6 of FIG. 3. Note that FIG. 6 includes door 106 in the closed position depicted in FIG. 1. It is seen that door 106 is located opposite wall 134 when in the closed position. Wall 134 is substantially perpendicular to walls 130 and 132 and interconnects walls 130 and 132, as suggested in FIG. 4. Shell 104 includes opposing end-walls 136 and 138 that are substantially perpendicular to sidewalls 130 and 132 and wall 134. Shell 104 has an opening 140, as shown in FIG. 2, opposite wall 134 that is selectively covered by door 106. In one embodiment, shell 104 and door 106 are of aluminum or the like.

Figure 7:
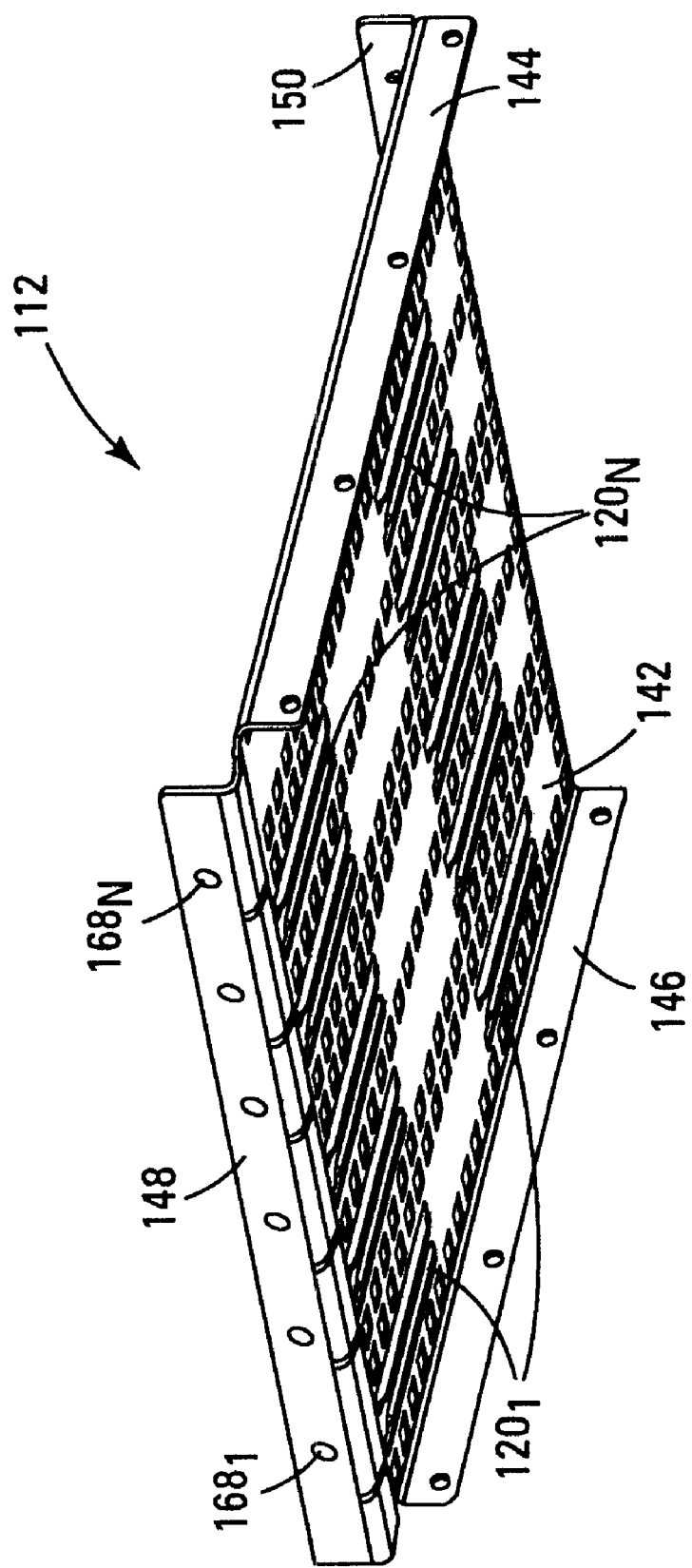
FIG. 7 is an isometric view of an embodiment of a shelf of the electronic module of FIG. 1.

FIG. 7 is an isometric view of shelf 112. Slots $120_1$ to $120_N$ are disposed on a surface 142 of shelf 112. Shelf 112 has opposing edges 144 and 146 that are substantially perpendicular to surface 142. Shelf 112 also includes opposing edges 148 and 150 that are substantially perpendicular to surface 142 and are substantially perpendicular to edges 144 and 146. Edges 144 and 146 substantially continuously frictionally engage walls 130 and 132 of shell 104, respectively, as illustrated for edge 144 in FIG. 2, and edge 150 substantially continuously contacts wall 134, as shown in FIG. 6. This thermally couples shelf 112 to shell 104. In one embodiment, edges 144, 146 and, 150 are substantially permanently attached to walls 130, 132, and 134 by riveting or the like. In another embodiment, edges 144, 146, and 150 are removably attached to walls 130, 132, and 134 by bolting, screwing, or the like. In various embodiments, shelf 112 is of aluminum or the like. In some embodiments, a thermally conductive interface material, such as thermally conducting grease, is disposed between edges 144, 146, and 150 and walls 130, 132, and 134 to improve thermal contact.

Figure 8:
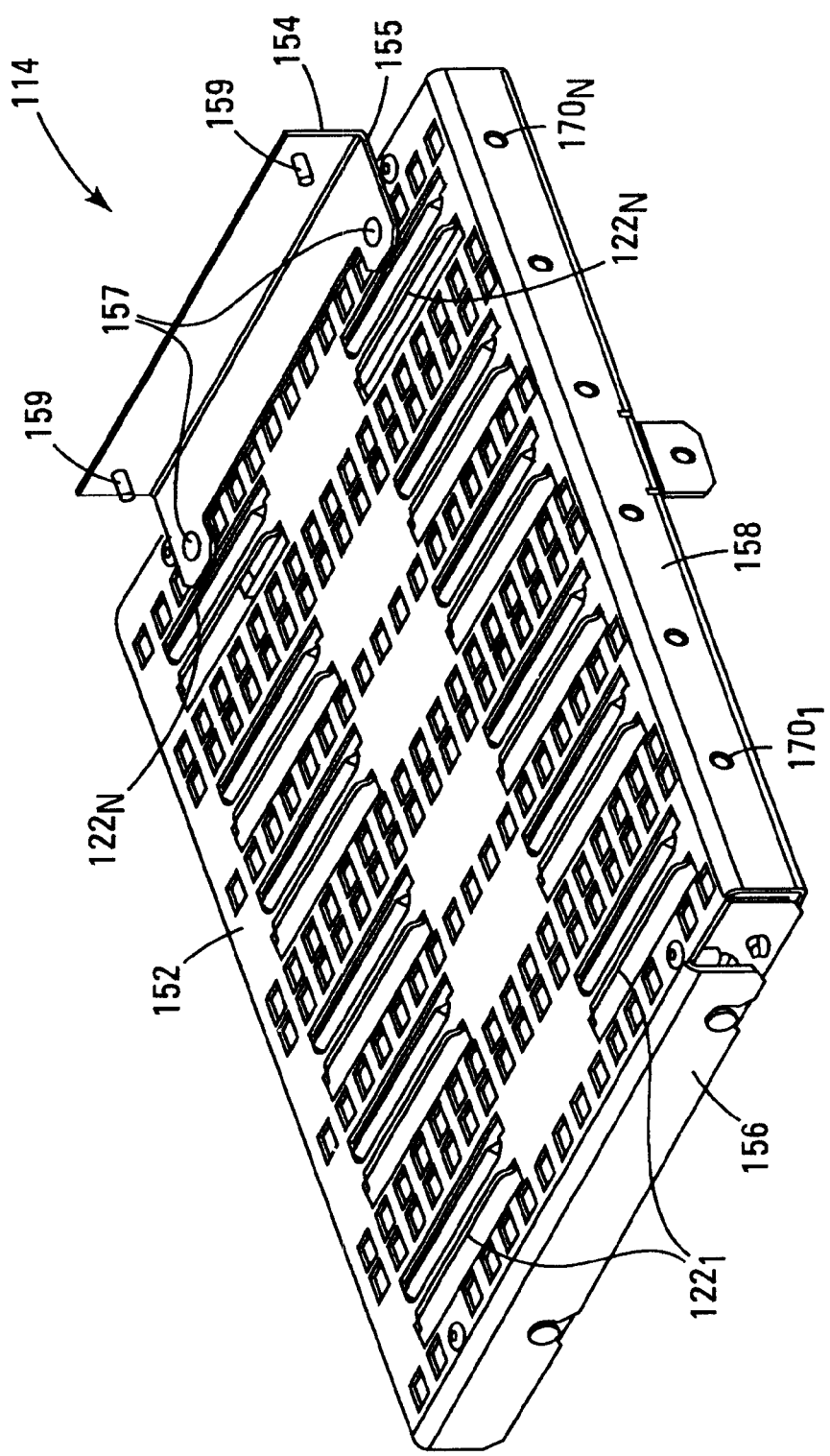
FIG. 8 is an isometric view of an embodiment of another shelf of the electronic module of FIG. 1.

FIG. 8 is a top isometric view of shelf 114. Slots $122_1$ to $122_N$ are disposed on a surface 152 of shelf 114, as shown. Shelf 114 has opposing edges 154 and 156 that are substantially perpendicular to surface 152. In one embodiment, edge 154 is integral with shelf 114. In another embodiment, edge 154 is provided by a bracket 155 that is attached to surface 152 by fasteners 157, such as bolts, rivets, screws, or the like. Shelf 114 also includes an edge 158 and an edge 160 (not shown) opposite edge 158 that are substantially perpendicular to surface 152 and are substantially perpendicular to edges 154 and 156. Edges 154 and 156 are respectively removably attached to walls 130 and 132 by fasteners 159, e.g., bolts, screws, or the like, as shown for edge 154 in FIG. 2, so as to make direct contact with walls 130 and 132. This thermally couples shelf 114 to shell 104. In one embodiment, shelf 114 is of aluminum or the like. In some embodiments, a thermally conductive interface material, such as thermally conducting grease, is disposed between edges 154 and 156 and walls 130 and 132 to improve thermal contact.

During operation, each of electronic circuit cards $118_1$ to $118_N$ dissipates heat. A portion of the heat is transferred to shelves 112 and 114. In turn, the heat transferred to shelf 112 is conducted from edges 144, 146, and 150 to shell 104 by virtue of the substantially continuous frictional engagement between edges 144 and 146 and walls 130 and 132 and the substantially continuous contact between edge 150 and wall 134. Similarly, the heat transferred to shelf 114 is conducted from edges 154 and 156 to shell 104 by virtue of the direct contact between edges 154 and 156 and walls 130 and 132. The frictional engagement between edges 144 and 146 of shelf 112 and walls 130 and 132, the direct contact between edges 154 and 156 of shelf 114 and walls 130 and 132, and the contact between edge 150 of shelf 112 and wall 134 increases heat transfer from shelves 112 and 114 to housing 102 compared to situations where air gaps separate shelves of a housing from the housing.

A backplane 162 is secured to wall 134, as shown in FIG. 6, by screwing, bolting, or the like. In one embodiment, spacers 164 space backplane 162 away from wall 134. In another embodiment, backplane 162 is located between shelf 114 and wall 134 and between shelf 112 and wall 138. Backplane 162 includes connectors $166_1$ to $166_N$, as shown in FIG. 3, that respectively align with aligned pairs of slots $124_1$ to $124_N$. Electronic circuit cards $118_1$ to $118_N$ are respectively inserted into aligned pairs of slots $124_1$ to $124_N$ and are respectively received by connectors $166_1$ to $166_N$ to electrically interconnect electronic circuit cards $118_1$ to $118_N$ to backplane 162. For example, FIG. 4 shows electronic circuit card $118_2$ connected to connector $166_2$. In one embodiment, backplane includes a number of protectors 176 (shown in FIGS. 2–4 and 6), such as gas-tube protectors, for protecting electronic circuit cards $118_1$ to $118_N$ against power surges induced by lightening, power cables, or the like.

In some embodiments, edge 148 of shelf 112 includes threaded apertures $168_1$ to $168_N$, as shown in FIG. 7, and edge 158 of shelf 114 includes threaded apertures $170_1$ to $170_N$, as shown in FIG. 8. In these embodiments, fasteners 172 and 174 respectively thread into threaded apertures 168 and 170 to secure electronic circuit cards 118 to shelves 112 and 114 at edges 148 and 158, respectively, as illustrated in FIG. 4 for electronic circuit card $118_1$ and threaded apertures $168_1$ and $170_1$.

In one embodiment, one or more conduits 192 pass through wall 138, as shown in FIGS. 2 and 6. Conduits 192 are adapted to provide substantially watertight lead-outs for cables. In one embodiment, conduits 190 are Heyco PIG-TAIL Strain Relief Bushings available from Heyco Products, Inc. Toms River, N.J.

In some embodiments, a fan 194 is disposed within housing 102, as shown in FIG. 6. Fan 194 circulates air within housing 102 for removing heat from electronic circuit cards 118.

Figure 9:
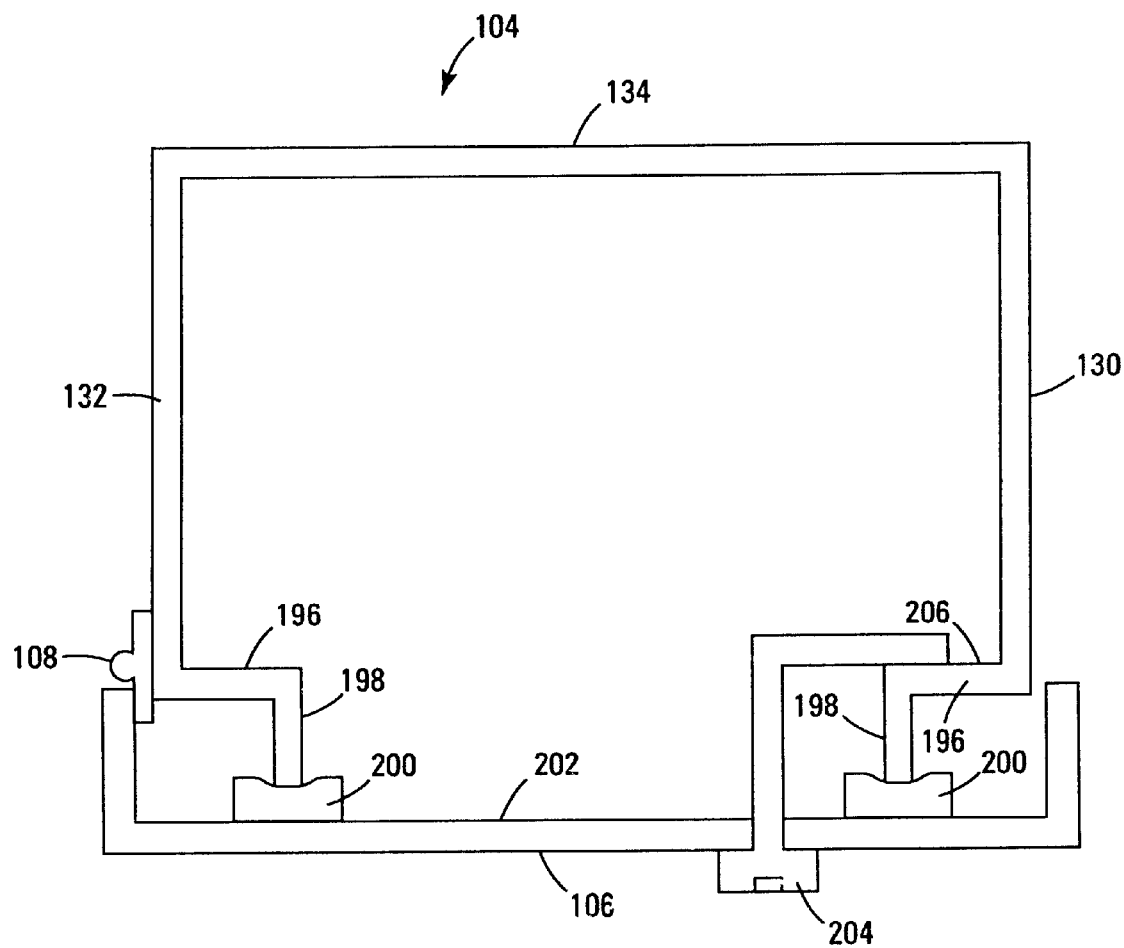
FIG. 9 is a cross-section viewed along line 9—9 of FIG. 1.

FIGS. 2 and 3 show that in one embodiment a flange 196 frames and extends into opening 140. A rim 198 projects substantially perpendicularly from flange 196. FIG. 6 shows flange 196 and rim 198 adjacent walls 136 and 138. FIG. 9 is a cross-section viewed along line 9—9 of FIG. 1 and shows flange 196 and rim 198 adjacent walls 130 and 132.

In one embodiment, a gasket 200 is attached to a surface 202 of door 106, as shown in FIGS. 6 and 9, using an adhesive or the like. When door 106 is in a closed position, rim 198 engages and compresses gasket 200 to seal shell 104 against the weather. In this way, door 106 selectively seals shell 104 against the weather. Alternatively, a gasket can be attached to flange 196 so that when door 106 closes shell 104, surface 202 of door 106 engages and compresses the gasket to seal shell 104 against the weather.

In one embodiment, door 106 includes latches 204, as shown in FIGS. 1 and 9. Latches are selectively rotated into engagement with a surface 206 of flange 196, as shown in FIG. 9, to selectively secure door 106 in the closed position.

Figure 10:
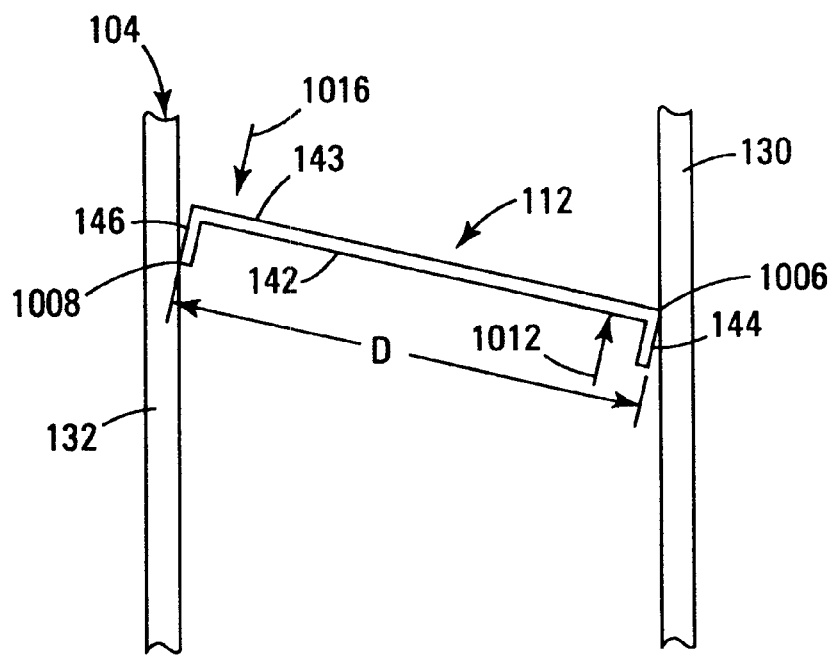
FIGS. 10–11 illustrate installing the shelf of FIG. 7 within the electronic module of FIG. 1 according to an embodiment of the present invention.
Figure 11:
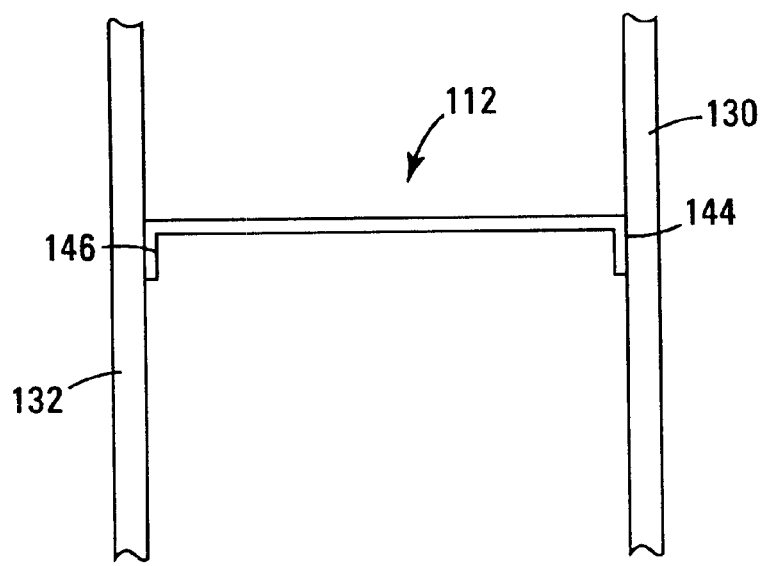

FIGS. 10 and 11 are cross-sectional views illustrating an embodiment of installing shelf 112 within shell 104 so that opposing edges 144 and 146 of shelf 112 frictionally engage walls 130 and 132 of shell 104, respectively, to thermally couple shelf 112 to shell 104. The distance D between edges 144 and 146 is such that shelf 112 cannot fit between walls 130 and 132 without each of edges 144 and 146 respectively exerting a force on each of walls 130 and 132. This results in frictional engagement between edges 144 and 146 and walls 130 and 132.

To install shelf 112, shelf 112 is rotated so that corners 1006 and 1008 of shelf 112 respectively engage walls 130 and 132, as shown in FIG. 10. Then, a force is applied to surface 142 adjacent edge 144, as indicated by arrow 1012, and/or to a surface 143, opposite surface 142, adjacent edge 146, as indicated by arrow 1016, e.g., using a hammer or the like, to rotate shelf 142 into the position shown in FIG. 11.

Removably attaching shelf 114 to shell 104 enables backplane 162 to be removed and installed via door 106 through opening 140. For example, to replace a faulty backplane 162 with a new backplane 162, door 106 is opened thereby uncovering opening 140. Electronic circuit cards 118$_1$ to 118$_N$ are disconnected from backplane 162 and removed through opening 140. Shelf 114 is detached from walls 130 and 132 and removed through opening 140. The faulty backplane 162 is detached from wall 134 and removed through opening 140. The new backplane 162 is passed through opening 140 and attached to wall 134. Shelf 114 is passed through opening 140 and attached to walls 130 and 132. Electronic circuit cards 118$_1$ to 118$_N$ are passed through opening 140 and connected to backplane 162. For housings where all of the shelves are substantially permanently attached to the housing, an additional opening is required in the housing, e.g., in wall 134, in order to remove and reinstall the backplane. This requires an additional door for opening and closing the additional opening. The additional opening and door add to the manufacturing cost of the housing. They also increase maintenance costs, e.g., hinge repair or replacement, weather seal replacement, etc.

CONCLUSION

Embodiments of the present invention have been described. The embodiments provide housings for electronic circuit cards. The housing includes a single door for selectively opening and closing the housing. A first shelf frictionally engages the housing to thermally couple the first shelf to the housing, and a second shelf directly contacts the housing to thermally couple the second shelf to the housing. This improves heat transfer between the shelves and the housing compared to situations where an air gap separates shelves from the housing. At least one of the shelves is removably attached to the housing to enable a backplane of the housing to be installed or removed via the single door. This eliminates the need for an additional door-covered opening for removing or installing the backplane within the housing, as is the case with housings where all of the shelves are substantially permanently attached to the housing.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, hinge 108 is not limited to a single continuous hinge, but can include two or more separate hinges. Shelf 112, in some embodiments, does not extend to wall 134 so that edge 150 makes contact with wall 134. It is manifestly intended that this invention be limited only by the following claims and equivalents thereof.

What is claimed is:

1. A housing for a plurality of electronic circuit cards comprising:
   a shell;
   a single door adapted to selectively close the shell;
   a first shelf having opposing first and second edges in frictional engagement with the shell and that thermally couple the first shelf to the shell;
   a second shelf having opposing first and second edges in direct contact with the shell and that thermally couple the second shelf to the shell;
   wherein the first and second shelves define a space therebetween for containing the plurality of electronic circuit cards;
   a backplane disposed within the shell, wherein the backplane is electrically connectable to each of the plurality of electronic circuit cards; and
   wherein the second shelf is removably attached to the shell to enable the backplane to be installed or removed via the single door.

2. The housing of claim 1, wherein the door selectively seals the shell against the weather.

3. The housing of claim 1, wherein the first and second shelves each comprise a plurality of slots, each slot adapted to receive an edge of one of the plurality of electronic circuit cards.

4. The housing of claim 1, wherein the door is pivotally attached to the shell.

5. The housing of claim 1, further comprising a fan for circulating air within the housing.

6. The housing of claim 1, wherein the backplane comprises a plurality of connectors respectively adapted to electrically interconnect each of the plurality of electronic circuit cards to the backplane.

7. The housing of claim 1, wherein the first shelf is substantially permanently attached to the shell.

8. The housing of claim 1, wherein the first shelf is removably attached to the shell.

9. The housing of claim 1, wherein a third edge of the first shelf contacts the shell to thermally couple the third edge to the shell.

10. The housing of claim 1, wherein a bracket attached to the second shelf provides the first edge of the second shelf.

11. A housing for a plurality of electronic circuit cards comprising:
    a shell having opposing first and second walls and a third wall substantially perpendicular to the first and second walls and interconnecting the first and second walls;
    a single door adapted to selectively close the shell, the door located opposite the third wall when closing the shell;

a first shelf having opposing first and second edges respectively frictionally engaging the first and second walls and that thermally couple the first shelf to the shell, the first shelf also having a plurality of slots disposed on a surface of the first shelf;

a second shelf having opposing first and second edges respectively in direct contact with the first and second walls and that thermally couple the second shelf to the shell, the second shelf having a plurality of slots disposed on a surface of the second shelf;

wherein the first and second shelves define a space therebetween for containing the plurality of electronic circuit cards, wherein each of the slots of the first shelf respectively align with each of the slots of the second shelf to form a plurality of aligned pairs of slots, each of the aligned pairs of slots for receiving each of the plurality of electronic circuit cards;

a backplane disposed on the third wall, the backplane electrically connectable to each of a plurality of electronic circuit cards; and wherein the second shelf is removably attached to the shell to enable the backplane to be installed or removed via the single door.

12. The housing of claim 11, wherein the door selectively seals the shell against the weather.

13. The housing of claim 11, wherein the door is pivotally attached to the shell.

14. The housing of claim 11, wherein the backplane comprises a plurality of connectors respectively adapted to electrically interconnect each of the plurality of electronic circuit cards to the backplane.

15. The housing of claim 11, further comprising a fan for circulating air within the housing.

16. The housing of claim 11, wherein the first shelf is substantially permanently attached to the shell.

17. The housing of claim 11, wherein the first shelf is removably attached to the shell.

18. The housing of claim 11, wherein a third edge of the first shelf contacts the third wall of the shell to thermally couple the third edge to the third wall.

19. The housing of claim 11, wherein a bracket attached to the second shelf provides the first edge of the second shelf.

20. An electronic module comprising:

a housing comprising:
a shell,
a single door adapted to selectively close the shell;
a first shelf disposed within the shell so that first and second edges of the first shelf frictionally engage the shell and that thermally couple the first shelf to the shell, the first shelf also having a plurality of slots disposed on a surface of the first shelf,
a backplane disposed within the shell, and
a second shelf disposed within the shell so that first and second edges of the second shelf directly contact the shell and that thermally couple the second shelf to the shell, the second shelf having a plurality of slots disposed on a surface of the second shelf, wherein the second shelf is removably attached to the shell to enable the backplane to be installed or removed via the single door; and
a plurality of electronic circuit cards disposed between the first and second shelves such that opposing edges of each of the plurality of electronic circuit cards respectively reside in one of the plurality of slots disposed on the surfaces of the first and second shelves, wherein each of the plurality of electronic circuit cards is electrically connected to the backplane and secured to the first and second shelves.

21. The electronic module of claim 20, wherein the door selectively seals the housing against the weather.

22. The electronic module of claim 20, wherein the door is pivotally attached to the shell.

23. The electronic module of claim 20, wherein the backplane comprises a plurality of connectors adapted to respectively electrically interconnect each of the plurality of electronic circuit cards to the backplane.

24. The electronic module of claim 20, further comprising a fan for circulating air within the housing.

25. The electronic module of claim 20, wherein the first shelf is substantially permanently attached to the shell.

26. The electronic module of claim 20, where in the f first shelf is removably attached to the shell .

27. The electronic module of claim 20, wherein a third edge of the first shelf contacts the shell to thermally couple the third edge to the shell.

28. A method for manufacturing a housing for electronic circuit cards, the method comprising:

forming a shell having an opening;

forming a single door;

pivotally attaching the single door to the shell adjacent the opening such that the door selectively covers the opening to selectively close the shell;

disposing a first shelf within the shell so that opposing first and second edges of the first shelf frictionally engage the shell and that thermally couple the first shelf to the shell;

attaching the first shelf to the shell;

disposing a backplane within the shell;

disposing a second shelf within the shell so as to form a space between the first and second shelves for containing the electronic circuit cards; and removably attaching the second shelf to the shell so that opposing first and second edges of the second shelf directly contact the shell and that thermally couple the second shelf to the shell, wherein removable attachment of the second shelf enables the backplane to be installed or removed through the opening.

29. The method of claim 28, wherein disposing the first shelf within the shell comprises exerting a force on the first shelf to frictionally engage the first and second edges of the first shelf with the shell.

30. The method of claim 28, wherein removably attaching the second shelf to the shell comprises removably attaching the first and second edges to the shell.

31. The method of claim 28, further comprising disposing a fan within the housing for circulating air within the housing.

32. The method of claim 28, wherein attaching the first shelf to the shell comprises substantially permanently attaching the first shelf to the shell.

33. The method of claim 28, wherein attaching the first shelf to the shell comprises removably attaching the first shelf to the shell.

34. The method of claim 28, wherein disposing a first shelf within the shell so that opposing first and second edges of the first shelf frictionally engage the shell comprises a third edge of the first shelf contacting the shell to thermally couple the third edge to the shell.

35. The method of claim 28, further comprising attaching a bracket to the second shelf for providing the first edge of the second shelf.

36. A method for manufacturing an electronic module, the method comprising:
   forming a shell having an opening;
   forming a single door;
   pivotally attaching the single door to the shell adjacent the opening such that the door selectively covers the opening to selectively close the shell;
   disposing a first shelf within the shell so that opposing first and second edges of the first shelf frictionally engage the shell and that thermally couple the first shelf to the shell;
   attaching the first shelf to the shell;
   disposing a backplane within the shell;
   removably attaching a second shelf to the shell so that opposing first and second edges of the second shelf directly contact the shell and that thermally couple the second shelf to the shell, wherein removable attachment of the second shelf enables the backplane to be installed or removed through the opening;
   inserting each of a plurality of electronic circuit cards into one of a plurality of slots disposed on a surface of the first shelf and one of a plurality of slots disposed on a surface of the second shelf so that each of the plurality of electronic circuit cards is located between the first and second shelves, wherein the surfaces of the first and second shelves are substantially parallel to each other and face each other; and
   electrically connecting each of the plurality of electronic circuit cards to the backplane.

37. The method of claim 36, wherein disposing the first shelf within the shell comprises exerting a force on the first shelf to frictionally engage the first and second edges of the first shelf with the shell.

38. The method of claim 36, further comprising attaching a bracket to the second shelf for providing the first edge of the second shelf.

39. The method of claim 36, further comprising disposing a fan within the housing for circulating air within the housing.

40. The method of claim 36, further comprising securing each of the plurality of electronic circuit cards to the first and second shelves.

41. The method of claim 36, wherein attaching the first shelf to the shell comprises substantially permanently attaching the first shelf to the shell.

42. The method of claim 36, wherein attaching the first shelf to the shell comprises removably attaching the first shelf to the shell.

43. The method of claim 36, wherein disposing a first shelf within the shell so that opposing first and second edges of the first shelf frictionally engage the shelf comprises a third edge of the first shelf contacting the shell to thermally couple the third edge to the shell.

44. A method for removing a backplane from an electronic module, the method comprising:
   opening a single door of a housing of the electronic module to uncover an opening in a shell of the housing;
   disconnecting each of a plurality of electronic circuit cards of the electronic module from the backplane, wherein the plurality of electronic circuit cards are located between a first shelf thermally coupled to the shell by direct contact with the shell and a second shelf thermally coupled to the shell by frictional engagement with the shell, wherein the first shelf is removably attached to the shell;
   removing each of the plurality of electronic circuit cards from the electronic module through the opening;
   detaching the first shelf from the shell;
   removing the first shelf from the electronic module through the opening;
   detaching the backplane from the shell; and
   removing the backplane from the module through the opening.

45. A method for installing a backplane in an electronic module, the method comprising:
   passing the backplane through an opening in a shell of a housing of the electronic module;
   attaching the backplane to the shell;
   passing a first shelf through the opening;
   removably attaching the first shelf to the shell so that the first shelf makes direct contact with the shell and that thermally couple the first shelf to the shell;
   passing a plurality of electronic circuit cards through the opening;
   inserting each of the plurality of electronic circuit cards between the first shelf and a second shelf that is thermally coupled to the shell by frictional engagement with the shell;
   electrically connecting each of the plurality of electronic circuit cards to the backplane; and
   closing the opening using a single door of the housing.

46. The method of claim 45, wherein closing the opening using a single door comprises sealing the opening against the weather.

* * * * *